(12) United States Patent
Tailliet et al.

(10) Patent No.: US 12,087,683 B2
(45) Date of Patent: Sep. 10, 2024

(54) LOW-DISPERSION COMPONENT IN AN ELECTRONIC CHIP

(71) Applicant: STMICROELECTRONICS (ROUSSET) SAS, Rousset (FR)

(72) Inventors: François Tailliet, Fuveau (FR); Guilhem Bouton, Peynier (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 357 days.

(21) Appl. No.: 17/566,437

(22) Filed: Dec. 30, 2021

(65) Prior Publication Data

US 2022/0122910 A1 Apr. 21, 2022

Related U.S. Application Data

(62) Division of application No. 16/033,109, filed on Jul. 11, 2018, now Pat. No. 11,244,893, which is a division of application No. 15/380,894, filed on Dec. 15, 2016, now Pat. No. 10,043,741.

(30) Foreign Application Priority Data

Jun. 28, 2016 (FR) ...................... 1656020

(51) Int. Cl.
| | |
|---|---|
| H01L 21/00 | (2006.01) |
| H01L 21/66 | (2006.01) |
| H01L 21/768 | (2006.01) |
| H01L 23/522 | (2006.01) |
| H01L 23/528 | (2006.01) |
| H01L 27/02 | (2006.01) |
| H01L 49/02 | (2006.01) |

(52) U.S. Cl.
CPC .... *H01L 23/5223* (2013.01); *H01L 21/76895* (2013.01); *H01L 22/20* (2013.01); *H01L 22/22* (2013.01); *H01L 22/32* (2013.01); *H01L 23/528* (2013.01); *H01L 27/0207* (2013.01); *H01L 28/60* (2013.01); *H01L 22/14* (2013.01)

(58) Field of Classification Search
CPC .......... H01L 23/5223; H01L 21/76895; H01L 22/20; H01L 22/22
See application file for complete search history.

(56) References Cited

U.S. PATENT DOCUMENTS

| | | | |
|---|---|---|---|
| 5,779,922 | A | 7/1998 | Boon et al. |
| 6,055,655 | A | 4/2000 | Momohara |
| 6,133,834 | A | 10/2000 | Eberth et al. |
| 6,147,011 | A | 11/2000 | Derderian et al. |

(Continued)

FOREIGN PATENT DOCUMENTS

| | | |
|---|---|---|
| CN | 1937232 A | 3/2007 |
| CN | 101030583 A | 9/2007 |

(Continued)

*Primary Examiner* — Laura M Menz
(74) *Attorney, Agent, or Firm* — Seed IP Law Group LLP

(57) ABSTRACT

A method of manufacturing electronic chips containing low-dispersion components, including the steps of: mapping the average dispersion of said components according to their position in test semiconductor wafers; associating, with each component of each chip, auxiliary correction elements; activating by masking the connection of the correction elements to each component according to the initial mapping.

12 Claims, 3 Drawing Sheets

(56) References Cited

U.S. PATENT DOCUMENTS

| | | |
|---|---|---|
| 6,191,971 B1 | 2/2001 | Tanaka et al. |
| 6,198,153 B1 | 3/2001 | Liu et al. |
| 6,201,272 B1 | 3/2001 | Kotecki et al. |
| 6,319,856 B1 | 11/2001 | Derderian et al. |
| 6,417,557 B1 | 7/2002 | Haruki |
| 6,787,477 B2 | 9/2004 | Derderian et al. |
| 6,962,875 B1 | 11/2005 | Stamper |
| 7,002,232 B2 | 2/2006 | Momohara |
| 7,079,375 B2 | 7/2006 | Fischer et al. |
| 7,363,099 B2 | 4/2008 | Smith et al. |
| 7,383,521 B2 | 6/2008 | Smith et al. |
| 7,399,711 B2 | 7/2008 | Perry et al. |
| 7,417,275 B2 | 8/2008 | Liu |
| 7,479,424 B2 | 1/2009 | Giraudin et al. |
| 7,531,011 B2 | 5/2009 | Yamasaki |
| 7,579,644 B2 | 8/2009 | Kim et al. |
| 7,626,402 B2 | 12/2009 | Sakamoto |
| 7,701,011 B2 | 4/2010 | Kamath et al. |
| 7,709,307 B2 | 5/2010 | Kamath et al. |
| 7,767,520 B2 | 8/2010 | Kamath et al. |
| 7,888,705 B2 | 2/2011 | Becker et al. |
| 8,207,569 B2 | 6/2012 | Bang |
| 8,227,320 B2 | 7/2012 | Subramanian et al. |
| 8,237,243 B2 | 8/2012 | Daley et al. |
| 8,296,943 B2 | 10/2012 | Smith et al. |
| 8,338,192 B2 | 12/2012 | Le Neel et al. |
| 8,424,176 B2 | 4/2013 | Smith et al. |
| 8,426,867 B2 | 4/2013 | Moriwaki |
| 8,627,259 B2 | 1/2014 | Huang et al. |
| 8,638,248 B2 | 1/2014 | Wu et al. |
| 8,739,096 B2 | 5/2014 | Jahnes et al. |
| 8,796,125 B2 | 8/2014 | Rockenberger et al. |
| 8,830,702 B2 * | 9/2014 | Macfarlane ............ H02M 1/083 363/19 |
| 8,848,417 B2 | 9/2014 | Petitprez |
| 8,990,744 B2 | 3/2015 | Beer et al. |
| 9,398,239 B2 | 7/2016 | Ito et al. |
| 9,431,220 B1 | 8/2016 | Ohashi et al. |
| 9,431,338 B2 | 8/2016 | Priel et al. |
| 9,484,249 B1 | 11/2016 | Ohashi et al. |
| 10,043,741 B2 * | 8/2018 | Tailliet .................... H01L 22/20 |
| 11,244,893 B2 * | 2/2022 | Tailliet .............. H01L 21/76895 |
| 11,515,247 B2 * | 11/2022 | Park .................... H01L 23/5223 |
| 2002/0009848 A1 | 1/2002 | Derderian et al. |
| 2002/0083401 A1 | 6/2002 | Breiner et al. |
| 2003/0229410 A1 | 12/2003 | Smith et al. |
| 2003/0229479 A1 | 12/2003 | Smith et al. |
| 2004/0087041 A1 | 5/2004 | Perry et al. |
| 2004/0129999 A1 * | 7/2004 | Jung ................... H01L 23/5252 257/E21.018 |
| 2004/0201077 A1 | 10/2004 | Momohara |
| 2005/0132306 A1 | 6/2005 | Smith et al. |
| 2005/0139885 A1 | 6/2005 | Liu |
| 2006/0061936 A1 * | 3/2006 | Yamasaki ................ H01G 4/38 257/E23.079 |
| 2006/0097580 A1 | 5/2006 | Fischer et al. |
| 2006/0234464 A1 * | 10/2006 | Giraudin .......... H01L 29/66181 257/E21.59 |
| 2007/0267673 A1 | 11/2007 | Kim et al. |
| 2007/0287237 A1 | 12/2007 | Rockenberger et al. |
| 2008/0042212 A1 | 2/2008 | Kamath et al. |
| 2008/0044964 A1 | 2/2008 | Kamath et al. |
| 2008/0048240 A1 * | 2/2008 | Kamath ............ H01L 29/66825 257/E21.174 |
| 2008/0284452 A1 | 11/2008 | Sakamoto |
| 2008/0304205 A1 | 12/2008 | Bang |
| 2009/0032898 A1 | 2/2009 | Becker et al. |
| 2009/0137071 A1 | 5/2009 | Subramanian et al. |
| 2009/0283860 A1 | 11/2009 | Le Neel et al. |
| 2010/0123582 A1 | 5/2010 | Smith et al. |
| 2010/0149853 A1 | 6/2010 | Moriwaki |
| 2010/0237468 A1 | 9/2010 | Daley et al. |
| 2010/0296225 A1 | 11/2010 | Smith et al. |
| 2012/0169240 A1 * | 7/2012 | Macfarlane ............ H05B 45/38 323/210 |
| 2012/0236630 A1 | 9/2012 | Priel et al. |
| 2012/0313679 A1 | 12/2012 | Jang |
| 2012/0329179 A1 | 12/2012 | Huang et al. |
| 2013/0083586 A1 | 4/2013 | Petitprez |
| 2013/0088375 A1 | 4/2013 | Wu et al. |
| 2013/0154054 A1 * | 6/2013 | Jahnes ..................... H01G 5/38 257/532 |
| 2014/0151532 A1 | 6/2014 | Ito et al. |
| 2014/0291731 A1 | 10/2014 | Becker et al. |
| 2014/0310671 A1 * | 10/2014 | Beer ..................... G06F 30/394 716/127 |
| 2015/0145104 A1 | 5/2015 | Bauer et al. |
| 2017/0373001 A1 * | 12/2017 | Tailliet ................ H01L 23/5223 |
| 2018/0323141 A1 * | 11/2018 | Tailliet .............. H01L 21/76895 |
| 2019/0386092 A1 * | 12/2019 | Cheng ..................... H01L 28/88 |
| 2022/0122910 A1 * | 4/2022 | Tailliet ................ H01L 23/5223 |
| 2022/0223516 A1 * | 7/2022 | Park ...................... H01L 28/60 |
| 2022/0285080 A1 * | 9/2022 | Kim .......................... H04B 1/40 |
| 2023/0091666 A1 * | 3/2023 | Duong ..................... H01G 4/33 174/260 |
| 2023/0187340 A1 * | 6/2023 | Park .................... H01L 23/5223 257/532 |
| 2023/0223401 A1 * | 7/2023 | Yamaji .................... H01L 27/01 438/381 |
| 2023/0275004 A1 * | 8/2023 | Kim .................... H01L 23/5223 257/532 |
| 2023/0395491 A1 * | 12/2023 | Lan ......................... H01L 28/10 |

FOREIGN PATENT DOCUMENTS

| | | | | |
|---|---|---|---|---|
| CN | 206271699 U | * | 6/2017 | ........ H01L 21/76895 |
| CN | 107546143 A | * | 1/2018 | ........ H01L 21/76895 |
| CN | 107546143 B | * | 5/2021 | ........ H01L 21/76895 |
| CN | 116686087 A | * | 9/2023 | ............ H01L 21/702 |
| FR | 3053156 A1 | * | 12/2017 | ........ H01L 21/76895 |
| FR | 3053156 B1 | * | 11/2018 | ........ H01L 21/76895 |
| WO | WO-2022154878 A1 | * | 7/2022 | ............ H01L 21/702 |
| WO | WO-2023107183 A1 | * | 6/2023 | ........ H01L 23/5223 |
| WO | WO-2023235027 A1 | * | 12/2023 | ........... H01C 17/075 |

* cited by examiner

LOW-DISPERSION COMPONENT IN AN ELECTRONIC CHIP

BACKGROUND

Technical Field

The present disclosure relates to the manufacturing of electronic components such as integrated circuits and, more particularly, the present disclosure aims at forming within a semiconductor wafer components having a low dispersion with respect to one another.

Description of the Related Art

Integrated electronic circuits are generally manufactured from semiconductor wafers having a large number of identical electronic chips formed therein, said chips being subsequently separated from one another, generally by sawing.

The manufacturing of electronic chips comprises a large number of masking steps, specific operations being carried out according to the patterns of each mask, for example, dopant implantations, layer etchings, and electric connections in connection layers.

Conventionally, it can be observed that the electronic chips of a wafer contain elementary components such as capacitors, transistors, and memory cells, which exhibit certain dispersions of characteristics resulting from the manufacturing. In particular, a given component will not always have the same value from one semiconductor wafer to another, nor from one chip to another of a same semiconductor wafer.

In certain cases, such dispersions are highly critical, for example, when tuning capacitors are desired to be manufactured.

To overcome such dispersions, many solutions have been used in prior art, such as:
  imposing extremely strict constraints to the manufacturing method: this is expensive and the obtained dispersion limit is generally only in the order of ±7% within a wafer;
  sorting the obtained chips and rejecting bad chips: this may cause an efficiency loss greater than 10% if all chips for which there is a dispersion greater than ±5% are rejected; and/or
  performing laser adjustments at the end of the manufacturing: this is of course an expensive and lengthy technique.

Thus, methods enabling to decrease the manufacturing dispersion of electronic circuit chips to increase the manufacturing efficiency and avoid additional steps (sorting, laser adjustment . . . ).

BRIEF SUMMARY

Thus, an embodiment provides a method of manufacturing electronic chips containing low-dispersion components, comprising the steps of:
  mapping the average dispersion of said components according to their position in test semiconductor wafers;
  associating, with each component of each chip, auxiliary correction elements;
  activating by masking the connection of the correction elements to each component according to the initial mapping.

According to an embodiment, the components are capacitors and the correction elements are capacitors sharing an electrode with the main capacitor.

According to an embodiment, the capacitors are formed between two doped polysilicon layers and are provided with a dielectric formed of a succession of silicon oxide, nitride, and oxide layers.

According to an embodiment, the method provides step-and-repeat masking steps, one of the reticles being intended to ensure or not the connections of the auxiliary components, and wherein said reticle is shifted by a variable step in addition to the normal step-and-repeat step.

An embodiment provides a semiconductor wafer containing electronic chips, each chip comprising at least one component of a first type, this component being associated with auxiliary correction components connected or not according to the position of the chip in the wafer.

According to an embodiment, the components of the first type are capacitors and the auxiliary components are auxiliary capacitors sharing an electrode with the main capacitor and having surface areas much smaller than that of the main component, the auxiliary capacitors being connected or not according to the position of the chip in the wafer.

According to an embodiment, the capacitors are of ONO type.

An embodiment provides an integrated circuit chip obtained by sawing of a wafer such as hereabove.

The foregoing and other features and advantages will be discussed in detail in the following non-limiting description of dedicated embodiments in connection with the accompanying drawings.

DETAILED DESCRIPTION

Figure 1:
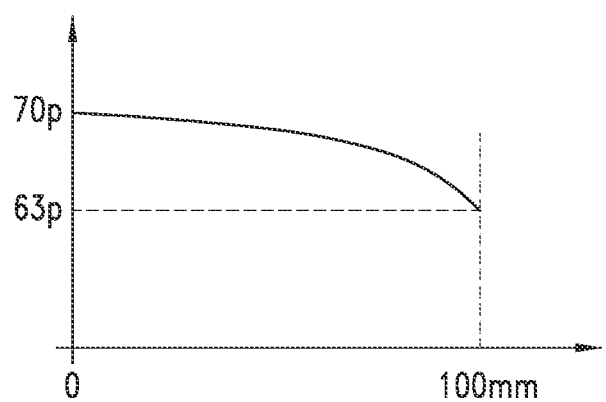
FIG. 1 shows the value of tuning capacitors arranged in various chips of a wafer according to the distance of these chips to the center of the wafer.

The same elements have been designated with the same reference numerals in the various drawings and, further, the various drawings are not to scale. For clarity, only those steps and elements which are useful to the understanding of the described embodiments have been shown and are detailed.

In the present description, to ease the understanding, only the specific case where tuning capacitors having as a dielectric a silicon oxide-nitride-oxide three-layer and having their opposite electrodes made of heavily-doped polysilicon will first be considered. Such capacitors will here be called ONO capacitors and may for example be used as tuning capacitors of a RF circuit. However, it should be noted that this is not the only application of the methods described herein.

The inventors have studied the dispersion of capacitances of ONO capacitors conventionally manufactured in a semiconductor wafer.

FIG. 1 shows, in ordinates, values of capacitance C and, in abscissas, distance r to the center of the semiconductor wafer of each chip having at least one ONO capacitor manufactured therein. It can be observed that if, for example, the capacitance value is 70 pF at the center of the chip it decreases to a value of approximately 63 pF at the chip periphery. This example is given in the case of a wafer having a 200-mm diameter (8 inches).

Figure 2:
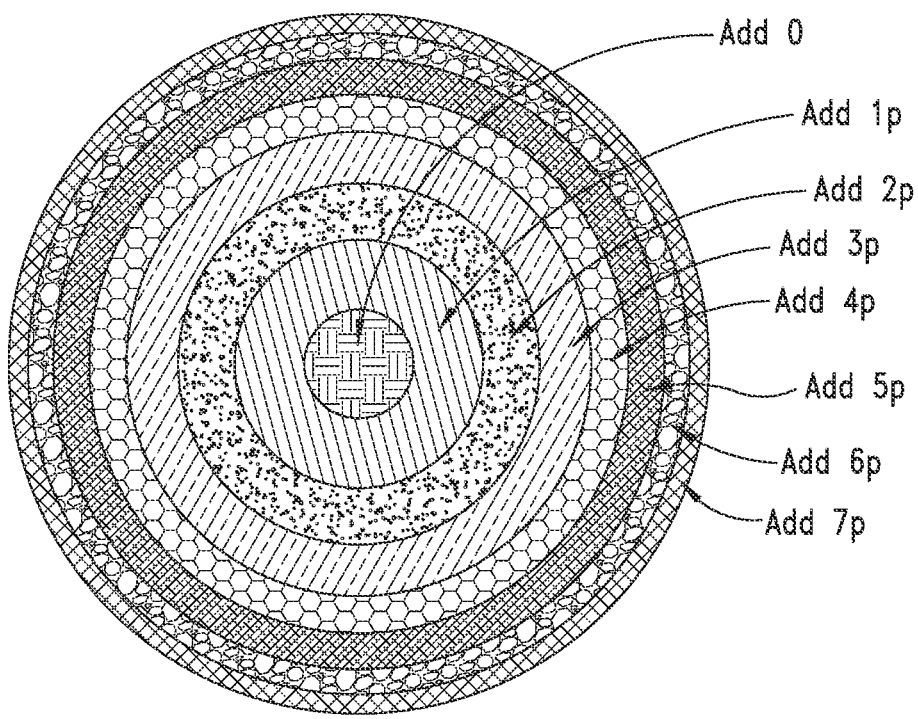
FIG. 2 illustrates a strategy of capacitance adjustment on a wafer.

FIG. 2 shows successive concentric areas of a semiconductor wafer. It should be noted that, if it is desired for all ONO capacitors to have the same 70-pF value at the center and at the periphery of the wafer, it is desirable, in the context of the example of FIG. 1, to keep the capacitors as such at the center (Add 0), to add 1 pF (Add 1p) to the capacitors located in the first ring, 2 pF (Add 2p) to the capacitors located in the next ring, 3 pF (Add 3p) to the capacitors located in the next ring, 4 pF (Add 4p) to the capacitors located in the next ring, 5 pF (Add 5p) to the capacitors located in the next ring, 6 pF (Add 6p) to the capacitors located in the next ring, and 7 pF (Add 7p) to the capacitors located in the last ring. Of course, such a division into seven areas is given as an example only. A finer division (more areas) or a rougher division (less areas) may be selected.

Figure 3:
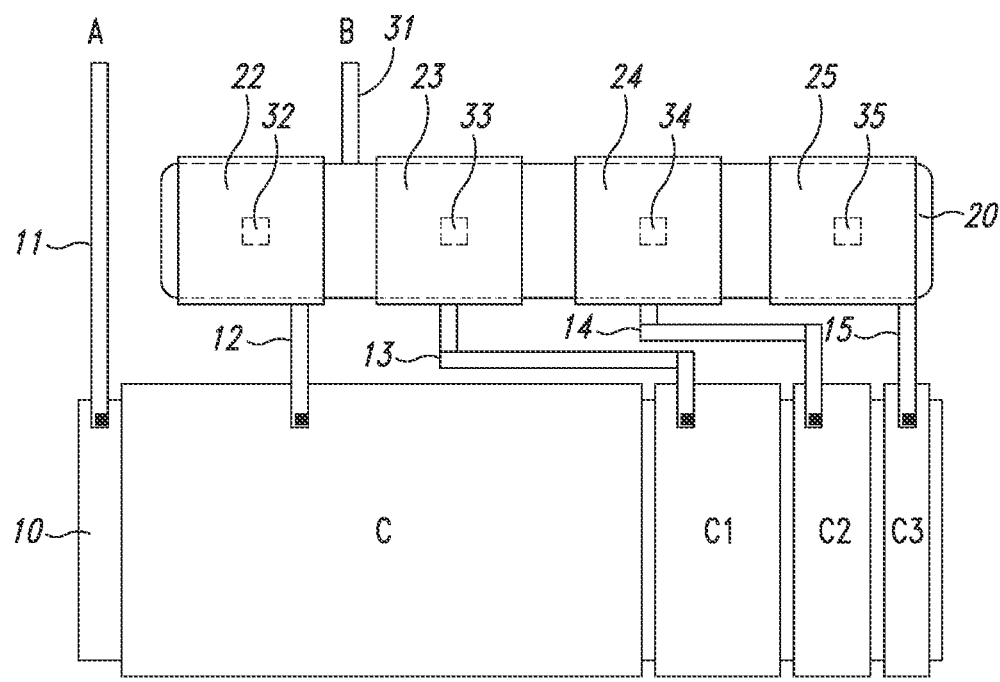
FIG. 3 shows a first embodiment of a dispersion-compensated capacitor structure.

As illustrated in FIG. 3, it is here provided to form each capacitor as having a single lower plate 10 and a plurality of upper plates C, C1, C2, C3. The lower and upper plates are for example made of doped polysilicon. Upper plate C has a surface area capable of providing, at the center of a wafer, a main capacitor C of desired capacitance, 70 pF in the example given herein. In this example, upper plates C1, C2, C3 correspond to auxiliary capacitors respectively having capacitances of 4, 2, and 1 pF.

A first connection metallization 11 extends between a contact, such as a conductive via in contact with lower plate 10, and a first node A of the capacitor. Connection metallizations 12, 13, 14, and 15 extend between conductive contacts on each of upper plates C, C1, C2, and C3 and pads 22, 23, 24, 25. Pads 22, 23, 24, 25 extend above a metallization 20 from which they are separated by an insulating layer, not shown. Metallization 20 is connected by a metallization connection 31 to a second node B of the capacitor.

According to whether contact pads 23, 24, 25 are placed or not in contact with metallization 20, one may add to capacitor C capacitors in parallel C1 and/or C2 and/or C3 to be able to add values in the range from 1 to 7 pF to the basic capacitor. This is done by masking. For all pads 23-25, a conductive via 33-35 is formed or not between each of the pads and metallization 20. All pads 22 are connected to metallization 20 by a conductive via 32. It should be noted that the fact that the upper plates of auxiliary capacitors C1, C2, C3 are always present, be they connected or not, enables to streamline the manufacturing, all the wafer capacitors being made in the same way. Only the mask corresponding to a step of definition of vias 33-35 is modified according to the wafer area where the capacitor is located.

The above example is particularly simple and corresponds to the case where a single mask is used to manufacture all the chips of a wafer. It should be noted that various embodiments may be selected to place in parallel at least one of capacitors C1, C2, C3 with capacitor C. Connections 13-15 for example may or may not be interrupted.

Actually, step-and-repeat methods are generally used to manufacture integrated circuits: masks or reticles are manufactured and the reticles are displaced from one area to the other of the wafer.

Figure 4:
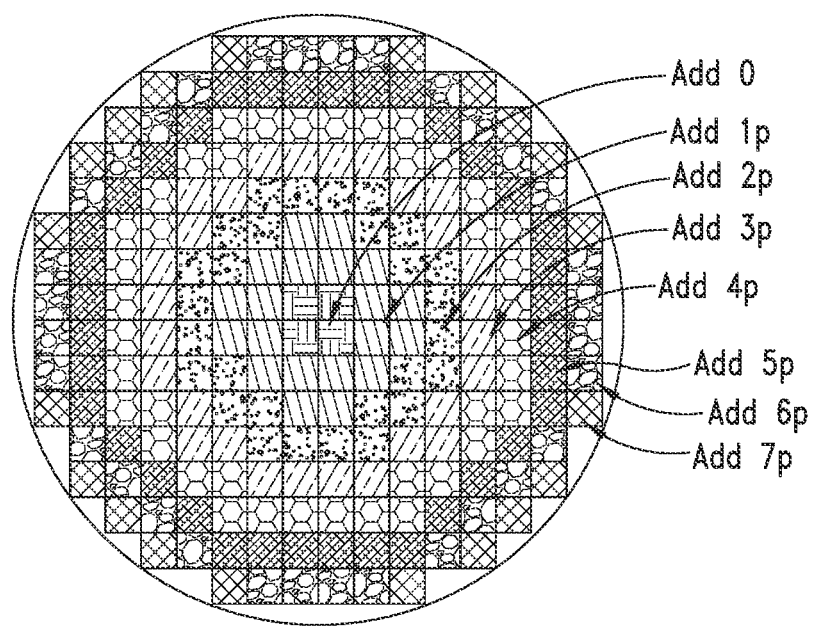
FIG. 4 shows the shape of patterns obtained by a step-and-repeat method on a silicon wafer.

Each of the squares illustrated in FIG. 4 corresponds to the dimension of the reticle which will be repeated. Each square generally comprises a plurality of chips, for example, 1,000. The squares corresponding to each of the ring-shaped areas of FIG. 2 will contain capacitors of same values, and this value will be shifted from the center to the periphery of the wafer according to areas (Add 0), (Add 1p), (Add 2p), (Add 3p), (Add 4p), (Add 5p), (Add 6p), and (Add 7p) described in relation with FIG. 2.

A problem is that, when a step-and-repeat method is used, all reticle patterns are identical given that the reticle cannot be modified from one repetition to the next one.

Figure 5:
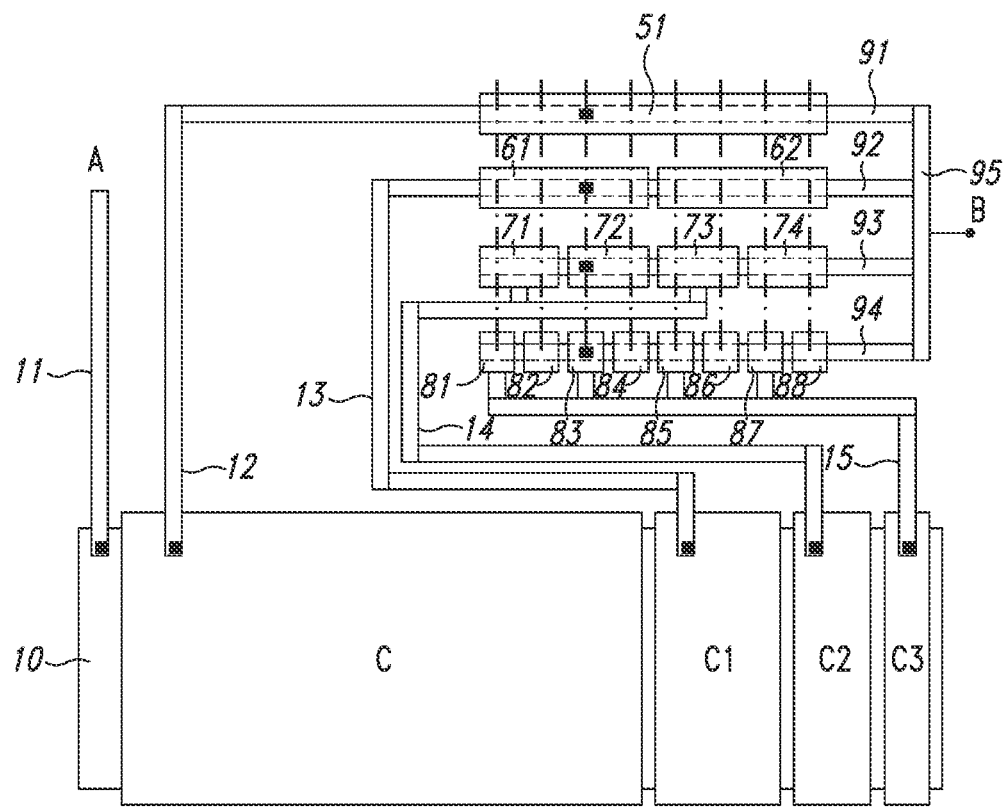
FIG. 5 shows a second embodiment of a dispersion-compensated capacitor structure.

FIG. 5 illustrates an embodiment of the auxiliary capacitor correction connections. In the example of FIG. 5, four capacitors C, C1, C2, C3 and rear conductive plate 10 connected, as previously, by a metallization 11 to a node A (first electrode of the capacitor) have been shown. Metallizations 12, 13, 14, and 15 connected to each of the upper conductive layers of capacitors C, C1, C2, C3 are connected, as shown as an example, to a sequence of pads arranged parallel to one another. Connection 12 is connected to a single elongated pad 51. Connection 13 is connected to one of two elongated pads 61 and 62 extending along half the length of pad 51. Connection 14 is connected to two alternated pads among four pads 71, 72, 73, 74 having half the length of pads 61 and 62 and extending parallel thereto. The last connection 15 to capacitor C3 is connected to four alternated pads among eight pads 81-88. The pads rest on an insulating layer (not shown) that is on elongated metallization strips 91, 92, 93, 94 interconnected by a metallization 95 corresponding to terminal B of the capacitor.

An example of locations to which the pads are connected or not by conductive vias through the insulating layer to the metallization formed under them has been shown by a line of vertically-aligned black squares. Pad 51 is always connected by a contact (a black square) to the underlying metallization, that is, terminal B always takes into account capacitor C. In the shown example, pad 61, connected to metallization 13, is also connected to underlying metallization 92, that is, capacitor C1 is arranged in parallel with capacitor C. Pad 72 is arranged at a location such that it is not connected to metallization 14. This means that capacitor C2 is not arranged in parallel on capacitors C and C1. However, pad 83 is connected to the underlying metallization, the pad being connected to metallization 15. Thus, capacitor C3 is arranged in parallel with capacitor C.

Accordingly, in this example, only capacitors C, C1, and C3 are connected in parallel, that is, in the context of the given numerical example, 4+1 pF are added to capacitance C (the values of capacitors C1 and C3).

It should be understood that, according to the horizontal shift of the row of vias, all values between 0 and 7 pF may be added to the capacitance of capacitor C. A specific mask determines the positions of the rows of vias and it is possible, in a step-and-repeat process, to slightly shift the step-and-repeat distance between two successive repetitions. This enables to shift the rows of vias. The shifting step may be 100 nm only in current advanced technologies.

An example where the shifting of the rows of vias is horizontal, it should however be understood that other configurations using vertical shifts or combinations of horizontal and vertical shifts may be selected. Thus, it is possible to obtain ONO capacitors which all have a same value, at the center as well as at the periphery of a semiconductor wafer. This is obtained without adding any additional manufacturing step, but only, in the example given hereabove, by slightly shifting the position of a mask during a step-and-repeat process.

As indicated at the beginning of the present disclosure, a specific example where ONO capacitors, for example used as tuning capacitors is a radio frequency circuit, are formed, has been given. The inventors have observed that the type of constant dispersion between the center and the periphery of a semiconductor wafer described in relation with FIG. 1 appears for other components. Such a dispersion may exist for MOS transistors, for memory cells, for capacitors other than ONO capacitors, for example, MOS capacitors, or MIM (metal-insulator-metal) capacitors. In the case of MIM capacitors, the distribution of the capacitor values is substantially the same on a wafer (varying from the center to the periphery) as in the case of ONO capacitors. The inventors have observed that in other components, the distribution may be different.

Thus, the present disclosure generally provides a method of manufacturing an electronic chip containing low-dispersion components comprising the steps of mapping the average dispersion of said components according to their position in test semiconductor wafers; associating correction elements with each component of each chip; and connecting by masking correction elements to each component according to said initial mapping.

It should also be understood that the present disclosure applies to other masking processes than those which have been described herein.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An integrated circuit chip, comprising:
    a main capacitor having first and second electrodes;
    a first correction capacitor having first and second electrodes, the first electrode of the first correction capacitor being contiguous with the first electrode of the main capacitor, and the second electrodes of the main capacitor and first correction capacitor being spaced apart from each other;
    a metallization adjacent to the main capacitor and the first correction capacitor;
    first and second terminals, the first terminal being electrically coupled to the first electrode of the main capacitor and the second terminal being electrically coupled to the metallization;
    an insulating layer on the metallization;
    a conductive main pad and conductive first and second pads on the insulating layer;
    a main conductive via extending through the insulating layer and electrically connecting the main pad to the metallization; and
    a first auxiliary conductive via extending through the insulating layer and electrically connecting the metallization to one of the first and second conductive pads.

2. The integrated circuit chip of claim 1, wherein:
    the metallization includes first and second metallizations lines;
    the main pad is directly over the first metallization line and the main conductive via electrically connections the main pad to the first metallization line;
    the first and second conductive pads are directly over the second metallization line and the first auxiliary conductive via connects one of the first and second conductive pads to the second metallization line.

3. The integrated circuit chip of claim 2, wherein the metallization includes a third metallization line, the integrated circuit chip further comprising:
    a second correction capacitor having first and second electrodes, the first electrode of the second correction capacitor being contiguous with the first electrodes of the main capacitor and the first correction capacitor, and the second electrodes of the main capacitor and first and second correction capacitors being spaced apart from each other;
    third, fourth, fifth, and sixth conductive pads directly over the third metallization line, the third and fifth conductive pads being electrically coupled to the second electrode of the second correction capacitor and the fourth and sixth conductive pads being electrically insulated from the second electrode of the second correction capacitor, wherein one of the third, fourth, fifth, and sixth conductive pads is electrically coupled to the third metallization line.

4. The integrated circuit chip of claim 3, wherein:
    the first, second, and third metallization lines extend lengthwise parallel to each other in a first direction;
    the third and fourth conductive pads are aligned with portions of the first conductive pad and portions of the main conductive pad in a second direction perpendicular to the first direction; and
    the fifth and sixth conductive pads are aligned with portions of the second conductive pad and portions of the main conductive pad in the second direction.

5. The integrated circuit chip of claim 4, wherein one of the third, fourth, fifth, and sixth conductive pads is electrically coupled to the third metallization by a second auxiliary conductive via that is aligned with the main and first auxiliary conductive vias in the second direction.

6. An electronic circuit chip, comprising:
    a main capacitor having first and second electrodes each of doped polysilicon;
    a dielectric between the first and second electrodes and including a stack of dielectric layers;
    a first correction capacitor having first and second electrodes, the first electrode of the first correction capacitor being contiguous with the first electrode of the main capacitor, and the second electrodes of the main capacitor and first correction capacitor being spaced apart from each other;
    a metallization adjacent to the main capacitor and the first correction capacitor;
    first and second terminals, the first terminal being electrically coupled to the first electrode of the main capacitor and the second terminal being electrically coupled to the metallization;
    a conductive main pad and conductive first and second pads on the insulating layer;

a main conductive via electrically connecting the main pad to the metallization; and a first auxiliary conductive via extending through the insulating layer and electrically connecting the metallization to one of the first and second conductive pads.

7. The electronic chip of claim 6, wherein the stack of dielectric layers includes a succession of silicon oxide, nitride, and oxide layers.

8. The integrated circuit chip of claim 6, wherein:

the metallization includes first and second metallizations lines;

the main pad is directly over the first metallization line and the main conductive via electrically connections the main pad to the first metallization line;

the first and second conductive pads are directly over the second metallization line and the first auxiliary conductive via connects one of the first and second conductive pads to the second metallization line.

9. The integrated circuit chip of claim 8, wherein the metallization includes a third metallization line, the integrated circuit chip further comprising:

a second correction capacitor having first and second electrodes, the first electrode of the second correction capacitor being contiguous with the first electrodes of the main capacitor and the first correction capacitor, and the second electrodes of the main capacitor and first and second correction capacitors being spaced apart from each other;

third, fourth, fifth, and sixth conductive pads directly over the third metallization line, the third and fifth conductive pads being electrically coupled to the second electrode of the second correction capacitor and the fourth and sixth conductive pads being electrically insulated from the second electrode of the second correction capacitor, wherein one of the third, fourth, fifth, and sixth conductive pads is electrically coupled to the third metallization line.

10. The integrated circuit chip of claim 9, wherein:

the first, second, and third metallization lines extend lengthwise parallel to each other in a first direction.

11. The integrated circuit chip of claim 10, wherein the third and fourth conductive pads are aligned with portions of the first conductive pad and portions of the main conductive pad in a second direction perpendicular to the first direction.

12. The integrated circuit chip of claim 11, wherein, the fifth and sixth conductive pads are aligned with portions of the second conductive pad and portions of the main conductive pad in the second direction.

* * * * *